(12) United States Patent
Rinkleff et al.

(10) Patent No.: US 10,479,294 B2
(45) Date of Patent: Nov. 19, 2019

(54) CIRCUIT ARRANGEMENT

(71) Applicant: AUDI AG, Ingolstadt (DE)

(72) Inventors: Thomas Rinkleff, Ingolstadt (DE);
David Krause, München (DE)

(73) Assignee: Audi AG, Ingolstadt (DE)

( * ) Notice: Subject to any disclaimer, the term of this patent is extended or adjusted under 35 U.S.C. 154(b) by 351 days.

(21) Appl. No.: 15/423,000

(22) Filed: Feb. 2, 2017

(65) Prior Publication Data
US 2017/0217385 A1    Aug. 3, 2017

(30) Foreign Application Priority Data

Feb. 3, 2016    (DE) .................. 10 2016 001 196

(51) Int. Cl.
*B60R 16/023* (2006.01)
*H03H 7/42* (2006.01)
*H02M 1/12* (2006.01)

(52) U.S. Cl.
CPC .......... *B60R 16/023* (2013.01); *H02M 1/126* (2013.01); *H02M 2001/123* (2013.01); *H03H 7/427* (2013.01)

(58) Field of Classification Search
CPC .................................................. B60R 16/023
See application file for complete search history.

(56) References Cited

U.S. PATENT DOCUMENTS

| | | |
|---|---|---|
| 5,831,842 A | 11/1998 | Ogasawara |
| 6,163,122 A | 12/2000 | De Filippis |
| 9,083,234 B2 * | 7/2015 | Shudarek ............... H02M 1/126 |
| 2006/0049890 A1 | 3/2006 | Wasaki et al. |
| 2007/0288102 A1 | 12/2007 | Korzin |
| 2009/0284199 A1 * | 11/2009 | Kitanaka ................. H02M 1/12 318/400.24 |
| 2012/0063179 A1 | 3/2012 | Gong |
| 2013/0201734 A1 | 8/2013 | Jung |
| 2014/0347142 A1 | 11/2014 | Chang |
| 2018/0367025 A1 * | 12/2018 | Rasek ................... H02M 1/126 |

FOREIGN PATENT DOCUMENTS

| | | |
|---|---|---|
| DE | 43 40 341 A1 | 6/1995 |
| DE | 198 17 752 A1 | 10/1999 |
| DE | 697 27 553 T2 | 12/2004 |
| DE | 20 2009 013 362 U1 | 2/2010 |

(Continued)

OTHER PUBLICATIONS

European Search Report dated Jun. 23, 2017 by the European Patent Office in European Application No. EP 17 15 3672.

(Continued)

*Primary Examiner* — Daniel J Cavallari
(74) *Attorney, Agent, or Firm* — Henry M. Feiereisen LLC

(57) ABSTRACT

A circuit arrangement for an onboard network of a motor vehicle, includes a line having a first inductivity and connecting a component of a power electronics of an onboard network with an element, wherein the component is adapted for being clocked during operation of the power electronics at a clock frequency; and an absorber circuit assigned to the line and having a second inductivity and a capacitance, wherein the second inductivity of the absorber circuit is coupled with the first inductivity of the line.

19 Claims, 3 Drawing Sheets

(56) References Cited

FOREIGN PATENT DOCUMENTS

| | | |
|---|---|---|
| DE | 10 2008 062 133 A1 | 6/2010 |
| DE | 10 2010 044 621 A1 | 3/2012 |
| EP | 1 686 678 | 8/2006 |
| JP | 2000-201044 | 7/2000 |
| WO | WO 2014/189869 A1 | 11/2014 |

OTHER PUBLICATIONS

Translation of European Search Report dated Jun. 23, 2017 by the European Patent Office in European Application No. EP 17 15 3672.

\* cited by examiner

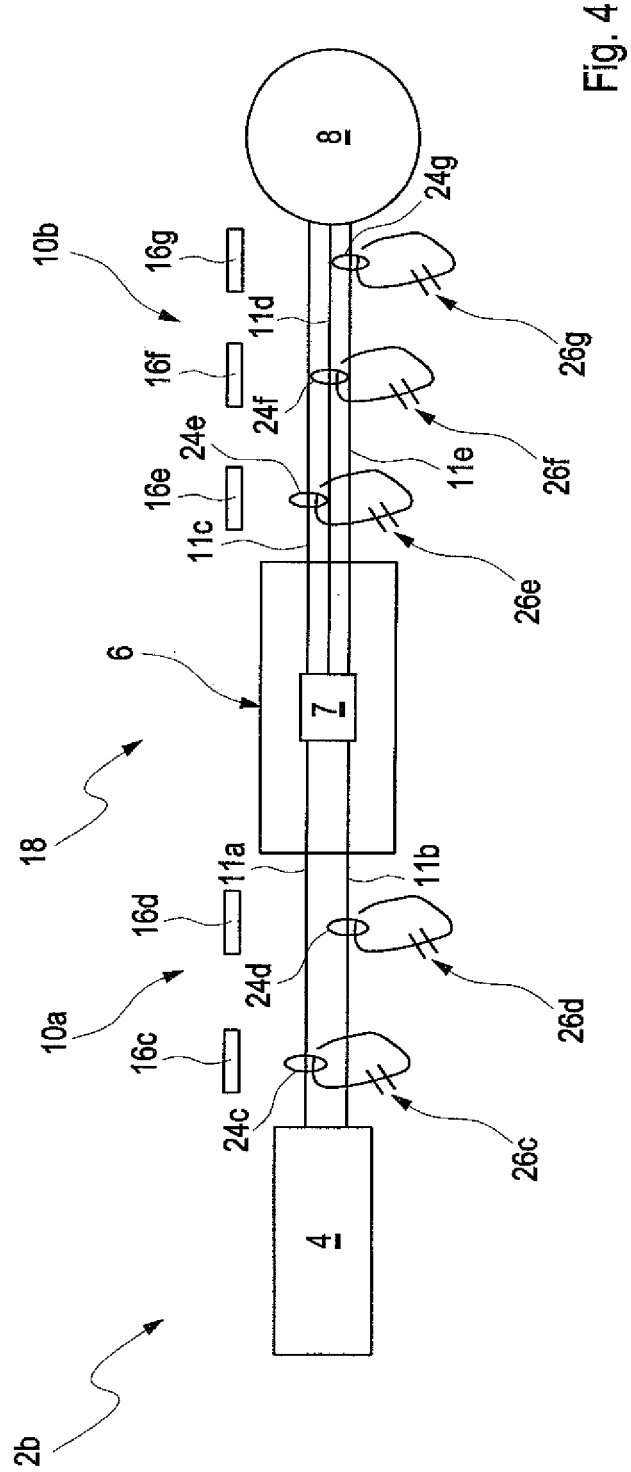
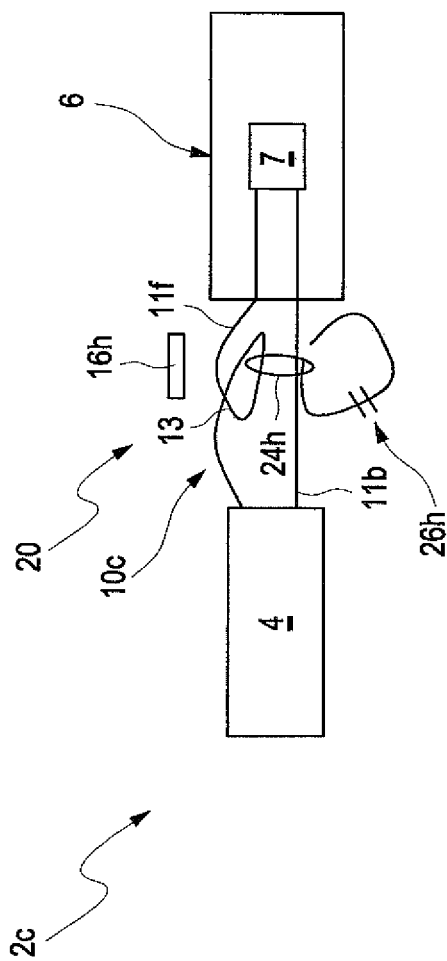

CIRCUIT ARRANGEMENT

CROSS-REFERENCES TO RELATED APPLICATIONS

This application claims the priority of German Patent Application, Serial No. 10 2016 001 196.3, filed Feb. 3, 2016, pursuant to 35 U.S.C. 119(a)-(d), the content of which is incorporated herein by reference in its entirety as if fully set forth herein.

BACKGROUND OF THE INVENTION

The invention relates to a circuit arrangement for an onboard network of a motor vehicle and an onboard network for a motor vehicle.

The following discussion of related art is provided to assist the reader in understanding the advantages of the invention, and is not to be construed as an admission that this related art is prior art to this invention.

An electrical onboard network of a motor vehicle has, inter alia, a power electronics, which is clocked at a defined frequency. Hereby current fluctuations may occur at a harmonic wave of this frequency, which may for example cause an acoustic whistling in an electric machine connected with the power electronics. In addition a battery of the onboard network, which is connected with the power electronics, may be excited due to the current fluctuations. The acoustic whistling may be perceived as a nuisance and should therefore be prevented.

SUMMARY OF THE INVENTION

According to one aspect of the present invention a circuit arrangement for an onboard network of a motor vehicle includes a line having a first inductivity and connecting a component of a power electronics of an onboard network with an element, wherein the component is adapted for being clocked during operation of the power electronics at a clock frequency; and an absorber circuit assigned to the line and having a second inductivity and a capacitance, wherein the second inductivity of the absorber circuit is coupled with the first inductivity of the line The circuit arrangement according to the invention is provided for an onboard network of a motor vehicle and includes at least one absorber circuit. The onboard network includes a power electronics and at least one element connected with the power electronics, wherein the power electronics includes at least one component, which can be clocked at a clock frequency during operation of the power electronics. The at least one component of the power electronics is connected to the at least one element of the onboard network via at least one line, wherein the at least one line has an inductivity. Assigned to the at least one line is the at least one absorber circuit with an inductivity and a capacitance, wherein the inductivity of the at least one absorber circuit is coupled with the at least one inductivity of the at least one line.

Generally the at least one component of the power electronics is connected with the at least one element of the onboard network via at least one set of lines, wherein each set of lines includes at least one inductivity, wherein at least one absorber circuit with an inductivity and a capacitance is assigned to each set of lines, wherein the inductivity of the at least one absorber circuit is coupled with the at least one inductivity of the respective set of lines. Usually a respective element is connected with the at least one component of the power electronics via a respective set of lines. In an embodiment the at least one element is integrated, besides the at least one component, also in the power electronics and/or a common housing, wherein the at least one line and the at least one assigned absorber circuit are integrated in the power electronics and/or the common housing.

According to another advantageous features of the invention, the circuit arrangement can include multiple absorber circuits. Besides the power electronics the onboard network has as elements such as an energy storage and an electric machine, wherein the energy storage is connected with the at least one component of the power electronics via a first set of lines. The at least one component of the power electronics is in addition connected with the electric machine via second set of lines. Each set of lines has at least one inductivity. In addition each set of lines is assigned at least one absorber circuit with an inductivity and a capacitance, wherein the inductivity of the at least one absorber circuit is coupled with the at least one inductivity of a respective set of lines.

Usually the first set of lines includes two lines between the energy storage, which is configured as a battery or an accumulator, and the at least one component, which two lines can also be configured and/or referred to as traction lines. The electric machine, which can be operated as a generator or motor, usually has three phases. Usually the second set of lines between the at least one component of the power electronics and the electric machine has three lines, wherein each line is connected with a phase of the electric machine. These lines of the second set of lines are usually configured and/or referred to as phase lines.

According to another advantageous features of the invention, at least two, i.e., two or three, usually all lines, of a respective set of lines have a common inductivity. Hereby, in an embodiment multiple such lines may not be surrounded by a shield, may be surrounded by individual shields about each of the lines separately or may be surrounded by a so-called total shield for shielding the lines. To this common inductivity and thus to the at least two lines a common absorber circuit is assigned whose inductivity is coupled with the common inductivity. Thus it is possible that the first set of lines, which has two lines, has a common inductivity for both lines to which the one common absorber circuit is assigned. In the case of the second set of lines, which includes three lines, these three lines have the common inductivity to which a common absorber circuit is assigned.

According to another advantageous features of the invention, the at least one line, usually each individual line, of a respective set of lines has its own inductivity, wherein to each own inductivity and thus each individual line an absorber circuit is assigned whose inductivity is coupled with the inductivity of the respective line.

According to another advantageous features of the invention, it is provided for two lines of a set of lines that a first line is straight and a second line includes a loop, which is wound in opposite direction relative to the first line. The first line and the loop of the second line have a common inductivity. Assigned to this common inductivity is an absorber circuit whose inductivity is coupled with the common inductivity. This embodiment is for example provided for the first set made of two lines.

The at least one inductivity of the at least one line or the respective set of lines is configured as a throttle and/or as a coil. The at least one inductivity of the at least one line or the respective set of lines is further configured as a component of at least one core, for example a ferrite core, which surrounds the at least one line or the respective set of lines.

This at least one core has a permeability μ≥1 and is for example made of ferromagnetic or nano-crystalline material or of Vitroperm®—material. Thus it is possible that for at least one set of lines a single core, for example the ferrite core, is provided, which surrounds all lines. This ferrite core includes an inductivity, usually the common inductivity for all lines. As an alternative it is possible that each individual line is surrounded by an individual ferrite core. Each of these ferrite cores includes a respective inductivity for a respective line. Hereby the at least one absorber circuit is assigned to the at least one ferrite core. In the case of a set of lines only having a common ferrite core, this common ferrite core is assigned an absorber circuit whose inductivity is coupled with the common inductivity of all lines. In the case the respective set of lines has multiple ferrite cores, each of the individual ferrite cores is assigned an absorber circuit whose inductivity is coupled with the inductivity of the respective ferrite core.

In addition a capacitance is connected in parallel to the at least one inductivity of the respective set of lines. When each line of a set of lines has its own inductivity, then a capacitance is connected in parallel to each of these inductivities. When the respective set of lines has a common inductivity the capacitance is connected in parallel to this one common inductivity. When the at least one inductivity of the respective set of lines is configured as a part of a core with a magnetic permeability μ≥1 it is possible that the capacitance connected in parallel thereto is also a part of the core. As an alternative it is possible that this capacitance is connected parallel to the core.

A resonance frequency of the at least one absorber circuit has an n-fold value of the clock frequency with which the at least one component of the power electronics can be clocked, wherein n is an integer number greater than 1.

According to another advantageous feature of the invention, the resonance frequency of the at least one absorber circuit can have the same value as the clock frequency or a first, second third . . . $n^{th}$ harmonic wave of the clock frequency with which the at least one component of the power electronics operates. Usually the first harmonic wave has a frequency with a value, which is twice as high as the clock frequency of the power electronics. Accordingly by selecting the inductivity and the capacitance of the at least one absorber circuit the resonance frequency of the absorber circuit can be adjusted to an n-fold value of the clock frequency of the harmonic wave, wherein the resonance frequency is for example the same, twice as high or n times as high as the clock frequency of the power electronics.

The at least one absorber circuit has an inductivity, a capacitance and a resistance which are connected in series, wherein a bandwidth of the at least one absorber circuit can be adjusted via a value of the resistance. Usually the inductivity of the at least one absorber circuit has an m-fold value of the inductivity of the at least one line. Hereby m is an integer value greater than 1. An n-fold resonance frequency of the at least one absorber circuit can be adjusted by selecting the capacitance.

According to another aspect of the present invention an onboard network for a motor vehicle includes a power electronics including a component, which is adapted for being clocked during operation of the power electronics at a clock frequency; an element connected to the power electronics; a line connecting the component with the element, wherein the line has a first inductivity; and an absorber circuit having a second inductivity and a capacitance, and being assigned to the line, wherein the second inductivity of the absorber circuit is coupled with the first inductivity of the line.

The at least one element is for example configured as an energy storage, which is connected with the at least one component of the power electronics via a set corn posed of two lines. As an alternative or in addition the at least one element is for example configured as an electric machine, which is connected with the at least one component via a set made of three lines. As an alternative or in addition the at least one element of the onboard network is configured as a charging device, an electric air-conditioning compressor or a high-voltage heater. Multiple lines that are combined to a set are configured and/or referred to as summation line.

It is also possible that the at least one element, the at least one component of the power electronics and the at least one line are configured as parts of a device of the onboard network and are for example arranged in a housing. In this respect is provided in a variant it that the power electronics and the electric machine are configured as a part of a device. Usually the electric machine includes as mechanical parts a rotor and a stator, which are connected with the at least one component of the power electronics via at least one line. In an embodiment the at least one absorber circuit, which is assigned to the at least one line, is also configured as a part of the device and is arranged in the same housing. It is also possible that the at least one element, which is connected with the at last one component of the power electronics via the at least one line, is also configured as a part of the power electronics and is thus arranged in the same device and/or housing. Accordingly also the at least one absorber circuit is configured as a part of the power electronics.

The at least one line is surrounded by a core made of a material that has a magnetic permeability m greater than 1.

BRIEF DESCRIPTION OF THE DRAWING

Other features and advantages of the present invention will be more readily apparent upon reading the following description of currently preferred exemplified embodiments of the invention with reference to the accompanying drawing, in which

FIG. 4 shows a schematic representation of a second embodiment of the onboard network according to the invention on the basis of the onboard network of FIG. 2 and a second embodiment of the circuit arrangement according to the invention.

FIG. 5 shows a schematic representation of a detail of a third embodiment of the onboard network on the basis of the onboard network of FIG. 2 and a third embodiment of the circuit arrangement according to the invention.

DETAILED DESCRIPTION OF PREFERRED EMBODIMENTS

Figure 1:
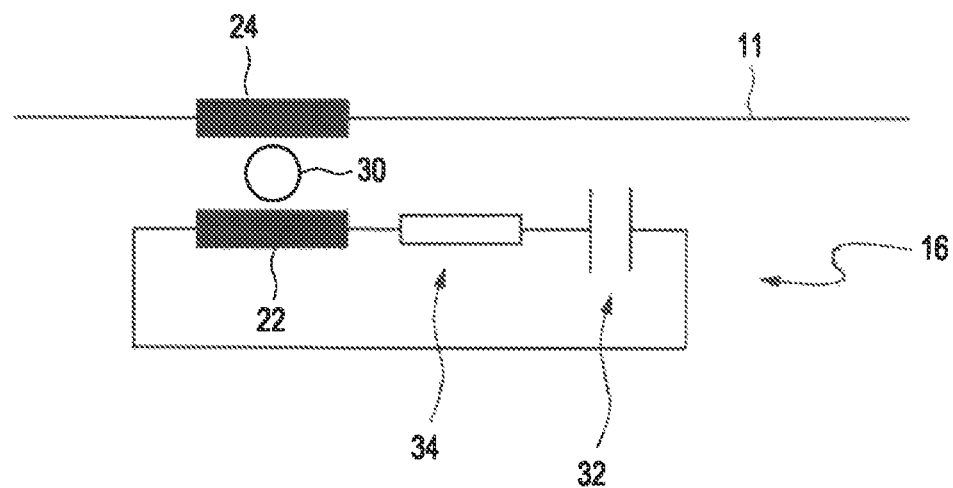
FIG. 1 shows a schematic representation of an example for an absorber circuit, which is configured as a part of an embodiment of the circuit arrangement according to the invention.

Throughout all the Figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

The absorber circuit 16 shown in FIG. 1 has an inductivity 22, a capacitance 32 or capacitor and an electric resistance 34. Hereby the electrical absorber circuit 16 is configured as a part of an embodiment of the electrical circuit arrangement 14, 18 or 20 as it is shown in one of the FIGS. 3 to 5. The absorber circuit 16 schematically shown in FIG. 1 is hereby representative for each absorber circuit 16a, 16b, 16c, 16d, 16e, 16f, 16g, 16h of one of the embodiments of the circuit arrangement 14, 18, 20. FIG. 1 also shows a line 11 of an onboard network 2, 2a, 2b, 2c as it is schematically shown in one of the FIGS. 2 to 5 below. This at least one line 11 represents and/or includes at least one line 11a, 11b, 11c, 11d, 11e, 11f of the respective onboard network 2, 2a, 2b, 2c and thus optionally also a set 10a, 10b, 10c of multiple lines 11a, 11b, 11c, 11d, 11e, 11f as schematically shown in FIGS. 2 to 5 below.

The at least one line 11a, 11b, 11c, 11d, 11e, 11f includes at least one inductivity 24. For realizing an embodiment of the circuit arrangement 14, 18, 20 according to the invention it is provided that the absorber circuit 16 is assigned to the at least one line 11 or 11a, 11b, 11c, 11d, 11e, 11f. Hereby the inductivity 22 of the absorber circuit 16 or 16a, 16b, 16c, 16d, 16e, 16f, 16g, 16h is arranged adjacent the at least one line 11 or 11a, 11b, 11c, 11d, 11e, 11f and is inductively coupled with the same, wherein such an inductive coupling is indicated in FIG. 1 with a circle 30. However, the absorber circuit 16 or 16a, 16b, 16c, 16d, 16e, 16f, 16g, 16h is galvanically decoupled for the at least one line 11 or 11a, 11b, 11c, 11d, 11e, 11f.

Figure 2:
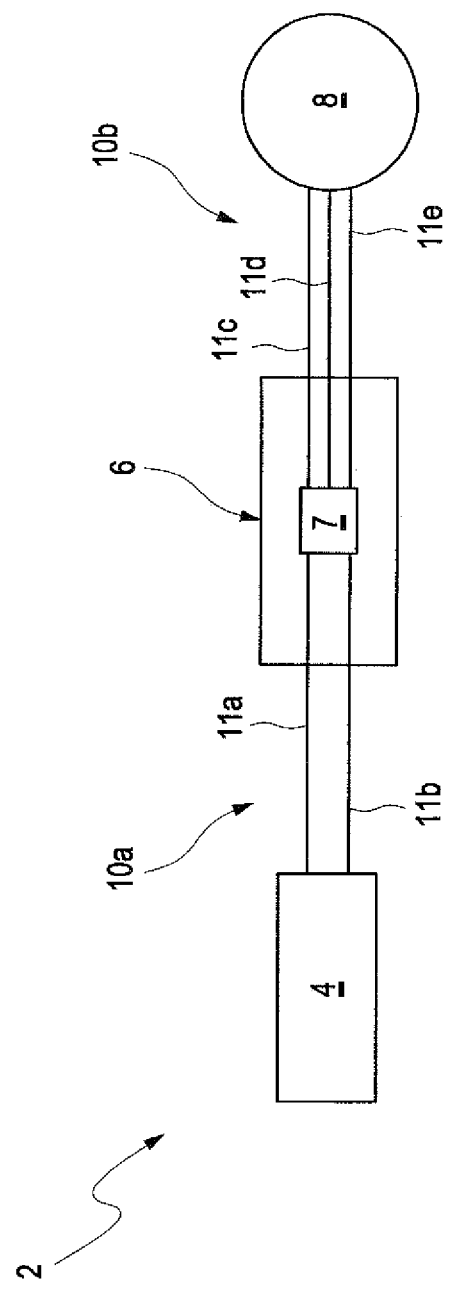
FIG. 2 shows a schematic representation of an example of an onboard network, for which an embodiment of a circuit arranged according to the invention is to be provided.

The example of the onboard network 2 for a motor vehicle schematically shown in FIG. 2 includes as components an energy storage 4 configured as a battery, a power electronics 6, which includes as a component 7 inter alia at least one pulse inverter, and an electric machine 8, which can be either operated as a generator or as a motor. When the electric machine 8 is operated as a generator mechanical energy is converted with this electric machine into electrical energy. When the electric machine 8 is operated as a motor electrical energy can be converted with the electric machine 8 into mechanical energy. Hereby it is provided that the electrical machine 8 has three phases.

In the present case the energy storage 4 and the at least one component 7 of the power electronics 6 are connected via a set 10a made of two lines 11a, 11b, in the present case traction lines. In addition the power electronics 6 and the electric machine 8 are connected with each other via a second set 10b of lines in this case three lines 11c, 11d, 11e, in the present case phase lines. Each phase of the electric machine 8 is assigned a line 11c, 11d, 11e, which form the second set 10b of lines.

The disclosed onboard network 2 is provided for a motor vehicle, which can be driven or propelled with at least one electric machine 8, as disclosed herein. Accordingly the motor vehicle is either configured as a pure electric vehicle, which can be driven purely electrically, or as hybrid vehicle. When the motor vehicle is configured as a hybrid vehicle it includes, beside the electric machine 8, at least one further motor for propulsion, usually an internal combustion engine.

It is also possible that an onboard network 2 has multiple power electronics 6 and electric machines 8.

The at least one component 7 of the power electronics 6 is clocked during operation of the onboard network 2 with an adjustable clock frequency. This clock frequency usually has a value of multiple thousand hertz. A harmonic wave, for example a first harmonic wave, of this clock frequency has a frequency with a value which is for example twice as high as the frequency value of the clock frequency. When the clock frequency of the at least one component 7 has a value of 9 kHz, the first harmonic wave has a frequency with a value of 18 kHz.

During operation of the power electronics 6, the at least one component 7 may develop an electromagnetic field, which also affects the energy storage 4 and the electric machine 8. Hereby the electric machine 8 may be excited at the frequency of a harmonic wave to an audible whistling. It is further possible that the energy storage 4 is also excited by the electromagnetic field of the at least one component 7 of the power electronics 6. Accordingly the electromagnetic field of the at least one component 7 of the power electronics 6 may interfere with an operation of the energy storage 4 and the electric machine 8. It is also possible that the electromagnetic filed is emitted via the lines 11a, 11b, 11c, 11d, 11e. It is also possible that due to the emitted electromagnetic filed of the at least one component 7 of the power electronics further here not shown elements of the onboard network 2 or the motor vehicle are subjected to interference.

Figure 3:
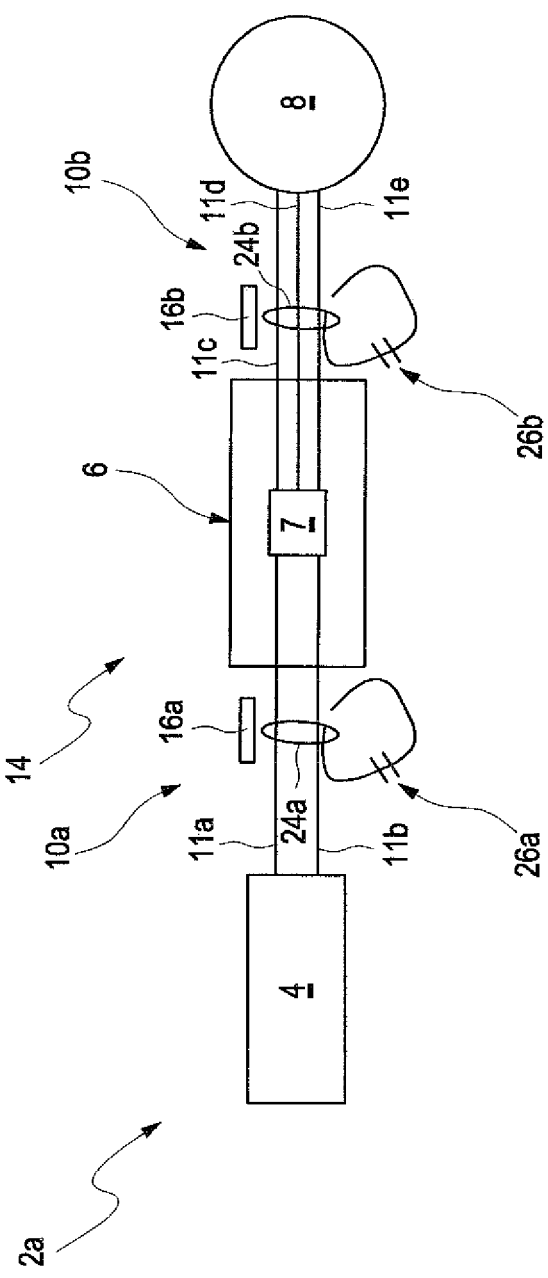
FIG. 3 shows a schematic representation of a first embodiment of the onboard network on the basis of the onboard network of FIG. 2 and a first embodiment of the circuit arrangement according to the invention.

The first embodiment of the circuit arrangement 14 according to the invention for the first embodiment of the onboard network 2a is schematically shown in FIG. 3 and includes a first absorber circuit 16a and a second absorber circuit 16b.

FIG. 3 further shows a first inductivity 24a, which in this case is assigned to the two lines 11a, 11b of the first set 10 of lines 11a, 11b. Assigned to this common inductivity 24 is the first absorber circuit 16a whose inductivity 22 is coupled with the common inductivity 24a of the first set 10a of lines 11a, 11b. Hereby it is further provided that the common inductivity 24a is configured as a part of a core which has a magnetic permeability μ>1 and surrounds both lines 11a, 11b. In the present case a capacitance 26a is connected in parallel to the common inductivity 24a.

In the present case a second inductivity 24b is assigned to the second set 10b, which includes the lines 11c, 11d, 11e. This second inductivity 24b, which is configured as common inductivity 24b for all lines 11c, 1d, 11e, is assigned the second absorber circuit 16b, whose inductivity 22 is coupled with the common inductivity 24b of the second set 10b of lines 11c, 11d, 11e. In addition the common inductivity 24b is configured as a part of a core, here a ferrite core, which surrounds all three lines 11c, 11d, 11e. As an alternative the core is made of a nano-crystalline material or another material with a permeability of >1. In the present case a capacitance 26b is connected in parallel to the common inductivity 24b.

The lines 11a, 11b, 11c, 11d, 11e are arranged at least between the power electronics 6 and the components, i.e., the energy storage 4 and the electric machine 8 of the onboard network 2a. In addition in the present embodiment it is provided that these lines 11a, 11 b, 11c, 11d, 11e are at least partially also arranged inside the power electronics 6 and are connected with e at least one component 7. In an embodiment at least one line 11a, 11b, 11c, 11 d, 11e is partially arranged in a housing of the power electronics 6. A common inductivity 24a, 24b, as shown in FIG. 3, is arranged between the power electronics 6 and the energy storage 4 or between the power electronics 6 and the electric machine 8. It is also possible that the inductivity 24a, 24b is arranged between the at least one component 7 and the energy storage 4 or between the at least one component 7 and the electric machine 8 inside the housing of the power electronics 6, for example between a connection of the respective line 11a, 11b, 11c, 11d, 11e and the at least one component 7. Correspondingly it is possible that an absorber circuit 16a, 16b, which is assigned to the inductivity 24a, 24b, is arranged outside of the housing of the power electronics 6 or inside the housing, usually between a respective power connection and the at least one component 7.

In an embodiment the at least one component 7 of the power electronics 6 is for example configured as a bipolar transistor with insulated gate electrode (IGBT). When contactors of the energy storage 4, which is configured as a battery may potentially be interfered with due to the electromagnetic field of the at least one component 7 the absorber circuit 16a is in this case to be arranged between the at least one component 7 and the contactors of the energy storage 4. In an embodiment it is possible that the lines 11a, 11b also partially extend inside the housing of the energy storage 4 and the inductivity 24a is also arranged inside the housing of the energy storage 4 or the power electronics 6. In this case the first absorber circuit 16a is also partially arranged inside the housing for example between the contactors and power connections for the lines 11a, 11b. Correspondingly it is also possible that the lines 11c, 11d, 11e and the common inductivity 24 are also arranged inside a housing of the electric machine 8 or the power electronics 6. In this case it is possible in an embodiment to arrange the absorber circuit 16b, which is assigned to the inductivity 24b, also inside the housing of eh electric machine 8.

With this first embodiment of the circuit arrangement 14 a so-called Common-Mode interference-suppression is achieved for the onboard network 2a. Depending on the definition it is provided that the at least one component 7 of the power electronics 6 is configured as a interference source and the energy storage 4 and the electric machine 8 are configured and/or referred to as interference sink. In the present case the absorber circuits 16a, 16b are arranged between the power electronics 6 and respectively a further element, i.e., the energy storage 4 and the electric machine 8 of the onboard network 2a.

In the second embodiment of the onboard network 2b according to the invention it is provided that each line 11a, 11b, 11c, 11d, 11e between the at last one component 7 of the power electronics 6 and a respective element, i.e., the energy storage 4 or the electric machine 8 of the onboard network 2b, has its own inductivity 24c, 24d, 24e, 24f, 24g to which respectively a capacitance 26c, 26d, 26e, 26f, 26g is connected in parallel. Hereby it is further provided that at least one respective inductivity 24c, 24d, 24e, 24f, 24g is configured as a part of a ferrite core which surrounds the respective line 11a, 11b, 11c, 11d, 11e.

In the second embodiment of the circuit arrangement 18 illustrated in FIG. 4 each inductivity 24c, 24d, 24e, 24f, 24g of a respective line 11a, 11b, 11c, 11d, 11e is assigned an absorber circuit 16c, 16d, 16e, 16f, 16g as it is shown exemplarily by way of the absorber circuit 16 of FIG. 1. Hereby a respective inductivity 2 of an absorber circuit 16c, 16d, 16e, 16f, 16g is coupled with the respective inductivity 24c, 24d, 24e, 24f, 24g of the respective line 11a, 11b, 11c, 11d, 11e.

By providing a respective inductivity 24c, 24d, 24e, 24f, 24g for each line 11a, 11b, 11c, 11d, 11e to which a respective absorber circuit 16c, 16d, 16e, 16f, 16g is assigned a differential interference-suppression can be achieved with the second embodiment of the circuit arrangement 2b.

In the detail view of the third embodiment of the onboard network 11c, which is schematically shown in FIG. 5, only the power electronics 6 and the energy storage 4 are shown as components of the onboard network 2c, hereby the at least one component 7 of the power electronics 6 is connected with the energy storage 4 via lines 11b, 11f, wherein these two lines 11b, 11f form a further set 10c of lines 11b, 11f. Hereby it is provided that the line 11b extends directly and/or straight between the at least one component 7 and in the energy storage 4, whereas the line 11f has a winding in opposite direction and thus has a loop 13. The line 11b and the loop 13 of the 11f and thus both lines 11b, 11f have a common inductivity 24h to which a capacitance 26h is connected in parallel. Hereby it is possible that the inductivity 24h is configured as a part of a core, for example a ferrite core, which surrounds the line 11b and the loop 13 of the line 11f.

The third embodiment of the circuit arrangement 20 shown in FIG. 5 in the present case includes an absorber circuit 16h, which is configured according to the absorber circuit 16 of FIG. 1. This absorber circuit 16h is assigned to the common inductivity 24h of the set 10c of lines 11b, 11f. The inductivity 22 of the absorber circuit 16h is hereby coupled with the common inductivity 24h of the set 10c of lines 11b, 11f.

All absorber circuits 16, 16a 16b, 16c, 16d, 16e, 16f, 16g, 16h include a serial connection of the capacitance 32 and the inductivity 22 (as exemplarily shown in FIG. 1 for the absorber circuit 16), which is configured as a throttle or coil. Usually the Ohm's resistance 34 is to be set low. A resonance frequency $f_R$ depends on a value L of the inductivity 22 and a value C of the capacitance and is $f_R=0.5/\pi*(LC)^{-0.5}$. A bandwidth of the resonance frequency $f_R$ can be adjusted by the resistance 34. In addition the resonance frequency can be adjusted in dependence on the clock frequency of the at least one component 7, wherein values L, C of the inductivity 22 and the capacitance 32 are to be selected. Usually the resonance frequency corresponds to an integer n-fold of the clock frequency. Each absorber circuit 16, 16a 16b, 16c, 16d, 16e, 16f, 16g, 16h can be inductively coupled via its inductivity 22 with a respective inductivity 24, 24a, 24c, 24d, 24e, 24f, 24g, 24h for the at least one line 11 or 11a, 11b, 11c, 11d, 11e, 11f. IN an embodiment the value C of the inductivity 22 is adjusted to a respective value of the inductivity 24, 24a, 24c, 24d, 24e, 24f, 24g, 24h of the onboard network 2, 2as, 2b, 2c as potential free system of the motor vehicle. Hereby the onboard network 2, 2a, 2b, 2c is configured as a D/C network and/or three-phase network. The value C of the capacitance 34 is to be selected as target frequency by taking the clock frequency of the at least one component 7 or an integer multiple of this clock frequency into account.

The frequency of a harmonic wave, for example the first harmonic wave, of the lock frequency of the at least one component 7 of the power electronics is for example 18 kHz and varies for example in dependence on a rotational speed of the electric machine 8 and a number of pole pairs of the electric machine. By taking such a deviation of the frequency of the harmonic wave into account a respective absorber circuit 16, 16a 16b, 16c, 16d, 16e, 16f, 16g, 16h can be configured broadband, which in turn can be realized by dimensioning of the resistance.

In an embodiment the inductivity 22 of the absorber circuit 16, 16a, 16b, 16c, 16d, 16e, 16f, 16g, 16h can be made of Vitroperm® or a nanocrystal and can have a high µ-value, which makes it possible to generate the resistance directly by the inductivity 22. A damping of the electromagnetic radiation of the at least one component 7 that can be achieved with the respective absorber circuit 16, 16a 16b, 16c, 16d, 16e, 16f, 16g, 16h also depends on a value of a respective inductivity 24, 24a, 24c, 24d, 24e, 24f, 24g, 24h of the at least one line 11 or 11a, 11b, 11c, 11d, 11e, 11f, wherein a value of a respective inductivity 24, 24a, 24c, 24d, 24e, 24f, 24g, 24h can for example be increased by multiple winding of core which is here configured as a ferrite core, which includes the respective inductivity 24, 24a, 24c, 24d, 24e, 24f, 24g, 24h and/or by using a throttle as inductivity 24, 24a, 24c, 24d, 24e, 24f, 24g, 24h.

When an onboard network 2, 2a, 2b, 2c has multiple power electronics 6 and electric machines 8, the at least one absorber circuit 16, 16a 16b, 16c, 16d, 16e, 161, 16g, 16h can be used for at least one power electronics 6, multiple power electronics 6 or all power electronics 6. In the case of multiple absorber circuits 16, 16a 16b, 16c, 16d, 16e, 16f, 16g, 16h, these can have different resonance frequencies.

What is claimed as new and desired to be protected by Letters Patent is set forth in the appended claims and includes equivalents of the elements recited therein:

What is claimed is:

1. A circuit arrangement for an onboard network of a motor vehicle, said circuit arrangement comprising:
   power electronics comprising a component which is clocked during operation of the power electronics at a clock frequency, the power electronics being connected, on the one hand, via a first line to a first element and, on the other hand, via a second line to a second element of the onboard network, with at least one of the first lines and the second lines having a first inductor configured as part of a ferrite core and surrounding the at least one line; and
   an absorber circuit comprising a second inductor, a resistor and a first capacitor connected in series, said second inductor of the absorber circuit being inductively coupled with the first inductor.

2. The circuit arrangement of claim 1, wherein the first line comprises two conductor wires connecting the component with the first element, with the first inductor being common to the two conductor wires, said second inductor of the absorber circuit being inductively coupled with the common first inductor.

3. The circuit arrangement of claim 1, wherein the first line comprises two conductor wires connecting the component with the first element, with at least one of the two conductor wires having an individual first inductor, said second inductor of the absorber circuit being inductively coupled with the individual first inductor.

4. The circuit arrangement of claim 2, wherein a first one of the two conductor wires extends straight and a second one of the two conductor wires includes a loop, which is wound in opposite direction relative to the first conductor wire, wherein the first conductor wire and the loop of the second conductor wire form the common first inductor, said second inductor of the absorber circuit being inductively coupled with the common first inductor.

5. The circuit arrangement of claim 1, wherein the first inductor of the line is configured as a choke.

6. The circuit arrangement of claim 1, wherein the first inductor comprises at least one core, which surrounds at least one of the first and second lines.

7. The circuit arrangement of claim 1, further comprising a second capacitor connected in parallel to the first inductor.

8. The circuit arrangement of claim 1, wherein selecting the second inductor and the first capacitor of the absorber circuit are selected so as to adjust a resonance frequency of the absorber circuit to an n-fold value of said clock frequency, with n being an integer number greater than or equal to 1.

9. The circuit arrangement of claim 1, wherein a bandwidth of the absorber circuit is adjustable via a resistance value of the resistor.

10. An onboard network for a motor vehicle, said onboard network comprising:
    power electronics including a component adapted for being clocked during operation of the power electronics at a clock frequency;
    a first element connected to the power electronics via a first line;
    a second element connected to the power electronics via a second element, with at least one of the first lines and the second lines having a first inductor configured as part of a ferrite core and surrounding the at least one line; and
    an absorber circuit comprising a second inductor, a resistor and a capacitor connected in series, said second inductor of the absorber circuit being inductively coupled with the first inductor.

11. The onboard network of claim 10, wherein the first element is configured as an energy storage device.

12. The onboard network of claim 10, wherein the second element is configured as an electric machine.

13. The onboard network of claim 10, wherein the ferrite core is made of a material which has a magnetic permeability of greater than 1.

14. The circuit arrangement of claim 1, wherein the component is a pulse inverter.

15. The circuit arrangement of claim 1, wherein the first element is an energy storage device.

16. The circuit arrangement of claim 1, wherein the second element is an electrical machine.

17. The onboard network of claim 10, wherein the component is a pulse inverter.

18. The circuit arrangement of claim 1, wherein the second line comprises three conductor wires connecting the component with the second element, with the first inductor being common to the three conductor wires, said second Inductor of the absorber circuit being inductively coupled with the common first inductor.

19. The circuit arrangement of claim 1, wherein the second line comprises three conductor wires connecting the component with the second element, with at least one of the three conductor wires having an individual first inductor, said second inductor of the absorber circuit being inductively coupled with the individual first inductor.

* * * * *